United States Patent

Buchwalter et al.

[11] Patent Number: 5,879,859
[45] Date of Patent: Mar. 9, 1999

[54] STRIPPABLE PHOTOIMAGEABLE COMPOSITIONS

[75] Inventors: Stephen Leslie Buchwalter, Hopewell Junction, N.Y.; Jeffrey Donald Gelorme, Plainville, Conn.; Nancy C. LaBianca, Yalesville, Conn.; Jame M. Shaw, Ridgefield, Conn.

[73] Assignee: International Business Machines Corporation, Armonk, N.Y.

[21] Appl. No.: 895,296

[22] Filed: Jul. 16, 1997

[51] Int. Cl.$^6$ ....................................................... G03C 5/00
[52] U.S. Cl. ........................ 430/280.1; 430/325; 430/326; 430/914; 430/921; 430/260
[58] Field of Search ................................. 430/259, 280.1, 430/914, 921, 260, 325, 326

[56] References Cited

U.S. PATENT DOCUMENTS

| | | | |
|---|---|---|---|
| 3,023,174 | 2/1962 | Bafzer et al. | 260/2 |
| 4,231,951 | 11/1980 | Smith et al. | 260/446 |
| 5,043,221 | 8/1991 | Koleske | 428/413 |
| 5,512,613 | 4/1996 | Afzali-Ardakani et al. | 523/443 |

*Primary Examiner*—John A. McPherson
*Assistant Examiner*—Rosemary Ashton
*Attorney, Agent, or Firm*—Pollock, Vande Sande & Amernick; Daniel P. Morris

[57] ABSTRACT

Strippable photoimageable compositions are provided that include a cycloaliphatic diepoxide and a photoactive compound. The compositions are especially useful for patterning a substrate.

26 Claims, No Drawings

STRIPPABLE PHOTOIMAGEABLE COMPOSITIONS

FIELD OF THE INVENTION

The present invention pertains to chemical compositions useful in patterning an underlying or overlaying layer by developing an image upon exposure to electromagnetic radiation. The compositions of the present invention are both etch resistant and readily stripped, and function as photoresists or photoimageable lift-off layers.

More particularly, the compositions of the present invention contain a cleavable epoxy material and a photoactive compound. Moreover, the photoimageable compositions of the present invention can act as positive or negative resists depending upon the type of photoinitiator employed. In addition, the present invention is concerned with a process for patterning a substrate employing the strippable photoimageable compositions of the present invention.

BACKGROUND OF INVENTION

One widely used method for forming a pattern such as metallic circuitry on a substrate in the manufacture of printed circuit boards in integrated circuits is to imagewise form a pattern of photoresist material over those areas of the substrate or over a metal-coated substrate to be shielded from metal deposition or metal removal. The photoresist layer is normally formed of a polymeric, organic material that is substantially unaffected by the metal deposition or metal removal process and, accordingly, protects the underlying areas.

Another method for forming such a pattern in a substrate is referred to as the "lift off" method that involves imagewise forming a pattern of photoresist material on substrate leaving exposed those areas where the pattern of, for instance, the metallic circuitry is to be provided. Then depositing over the entire surface the metal followed by removing the remaining photoresist which in turn removes the metal located above it, while leaving remaining the desired metallic circuitry.

The pattern in the above methods is formed by imagewise exposing the photoresist material to electromagnetic radiation through a photographic image, such as a glass master, by photolithographic techniques. The electromagnetic radiation is usually x-ray, U.V. radiation, or electron beam radiation.

A number of photoresist materials are well known and are capable of forming a desired masking pattern. However, providing compositions which exhibit acceptable imaging (resolution and acuity) characteristics to be suitable as an image or pattern mask, especially for integrated circuits, along with the ability to tailor the composition to providing either a positive or negative resist, is quite unusual.

Also, providing such compositions with the ability to achieve a readily strippable composition that is also etch resistant is even that much more difficult.

For photoresist technology, epoxy materials have significant advantages over other materials because of their excellent adhesion and structural integrity after curing. These advantages have meant that epoxies could be formulated into high resolution and high aspect ratio photoresists. However, stripping off these materials after the photoresist has served its purpose can be a problem because, as highly crosslinked network polymers, they are insoluble.

Similarly, a lift-off layer for fabricating microcircuits is only useful if it can be easily dissolved to remove unwanted overlaying material from the microcircuit. Thermoset epoxies cannot be used for this purpose despite some attractive properties because as crosslinked network polymers, they cannot be easily dissolved. An easily removed, crosslinked epoxy would be attractive as a lift-off layer because it could be applied with little or no solvent and cured in place, resulting in little shrinkage and excellent planarization.

SUMMARY OF THE INVENTION

The present invention provides epoxy thermoset materials exhibiting the desirable properties of epoxy materials including ability to be applied solventless, mechanical toughness, adhesion to most surfaces, and chemical resistance, along with easily removable or strippable after having served their purpose.

In addition, the compositions of the present invention are capable of acting as positive resists or negative resists depending upon the type of photoinitiator employed. Furthermore, the compositions of the present invention can be used in lift-off techniques because they are readily removed or stripped.

In particular, the compositions of the present invention are strippable and photoimageable and comprise a cycloaliphatic diepoxide and a photoactive compound. The cycloaliphatic diepoxide contains epoxy groups that are connected through an acyclic acetal moiety. The photoactive compound employed releases acid upon being exposed to electromagnetic radiation.

In addition, the present invention is concerned with a method for the production of a resist image which includes providing on a substrate the above-disclosed strippable photoimageable composition. The composition is imagewise exposed in a predetermined pattern to electromagnetic radiation and then developed.

BEST AND VARIOUS MODES FOR CARRYING OUT THE INVENTION

The cycloaliphatic diepoxide compounds employed according to the present invention are cleavable and contain two epoxide groups that are connected together through an acyclic acetal linkage. Examples of suitable diepoxide compounds are disclosed in U.S. Pat. No. 5,512,613, disclosure of which is incorporated herein by reference. The term "acetal" refers to the 1,1-dialkoxy group as deposited in Formulae 1 and 2 below where R and R' can be alkyl, aryl, aralkyl or hydrogen. The general use of the term "acetal" includes ketals (with R and R'=alkyl, aryl or aralkyl), acetals (with R=alkyl, aryl or aralkyl and R'=H) and formals (R and R'=H). As disclosed in *Advanced Organic Chemistry*, J. March, 3rd Edition, Wiley Interscience (1985), pp. 329–331, the known organic chemistry of acetals indicates that they are stable to hydrolysis in the absence of acids, but break down readily in acid, even weak acids. Acetals are not subject to reactions similar to those of epoxy groups, and thus an acetal link should not be affected by the curing reaction of the epoxy.

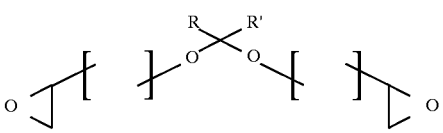

-continued

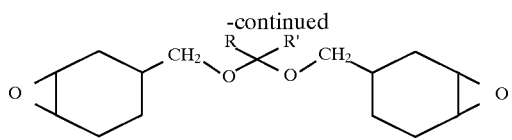
(2)

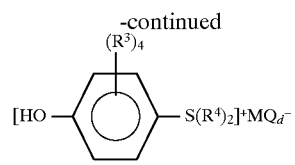

Examples of some specific diepoxides suitable for use in the present invention are acetaldehyde bis-(3,4-epoxycyclohexylmethyl) acetal, acetone bis-(3,4-epoxycyclohexylmethyl) ketal, and formaldehyde bis-(3,4-epoxycyclohexylmethyl) acetal.

The preferred diepoxide compound is acetaldehyde bis-(3,4-epoxycyclohexylmethyl) acetal, also referred to hereinafter as acetal diepoxide.

The compositions of the present invention also contain a photoinitiator or photoactive compound. The photoactive compound must be capable of releasing acid upon being exposed to electromagnetic radiation. Examples of such photoinitiators are well known and include onium salts and especially Group VIA and Group VIIA salts such as the pyrylium, selenonium, sulfonium, and iodonium salts. Various suitable photoinitiators are discussed in U.S. Pat. Nos. 4,161,478; 4,442,197; 4,139,655; 4,400,541; 4,197,174; 4,173,476; and 4,299,938; and European Patent Applications 44/0094914 and 84/0126712, disclosures of which are incorporated herein by reference.

Also see Watt, et al., "A Novel Photoinitiator of Cationic Polymerization: Preparation and Characterization of Bis[4-(diphenylsulfonio)phenyl]-sulfide-Bis-Hexafluorophosphase", *Journal of Polymer Science: Polymer Chemistry Edition*, Vol. 22, p. 1789, 1980, John Wiley & Sons, Inc.

Additional discussions concerning sulfonium and iodonium salts can be found, for instance, in Crivello, et al., "Complex Triarylsulfonium Salt Photoinitiators. II. The Preparation of Several New Complex Triarylsulfonium Salts and the Influence of Their Structure in Photoinitiated Cationic Polymerization", *Journal of Polymer Science: Polymer Chemistry Edition*, Vol. 18, pp. 2697–2714 (1980), John Wiley & Sons, Inc.; Pappas, et al., "Photoinitiation of Cationic Polymerization. III. Photosensitization of Diphenyliodonium and Triphenylsulfonium Salts", *Journal of Polymer Science: Polymer Chemistry Edition*, Vol. 22, pp. 77–84 (1984), John Wiley & Sons, Inc.; Crivello, et al., "Photoinitiated Cationic Polymerization with Triarylsulfonium Salts", *Journal of Polymer Science: Polymer Chemistry Edition*, Vol. 17, pp. 977–999 (1979), John Wiley & Sons, Inc.; Crivello et al., "Complex Triarylsulfonium Salt Photoinitiators. I. The Identification, Characterization, and Syntheses of a New Class of Triarylsulfonium Salt Photoinitiators", *Journal of Polymer Science: Polymer Chemistry Edition*, Vol. 18, pp. 2677–2695, (1980), John Wiley & Sons, Inc.; and Crivello, "Cationic Polymerization-Iodonium and Sulfonium Salt Photoinitiators", *Advances in Polymer Science*, Series #62, pp. 1–48 (1984), Springer-Verlag.

Examples of some sulfonium salts are arylacyldialkyl and hydroxyaryldialkyl sulfonium salts represented by the following formulae.

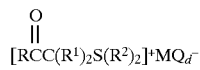
(1)

where R is a $C_{(6-13)}$ monovalent aromatic organic radical or substituted $C_{(6-13)}$ monovalent aromatic organic radical; $R^1$ is a monovalent radical selected from hydrogen, $C_{(1-8)}$ alkyl and mixtures thereof; $R^2$ is a $C_{(1-13)}$ monovalent organic radical; $R^3$ is a monovalent radical selected from $C_{(1-8)}$ alkyl, hydroxy, $C_{(1-8)}$ alkoxy, halo and nitro; $R^4$ is a $C_{(1-8)}$ alkyl radical; M is a metal or metalloid; Q is halogen; and d is equal to 4–6.

Example of arylacyldialkyl sulfonium salts are:

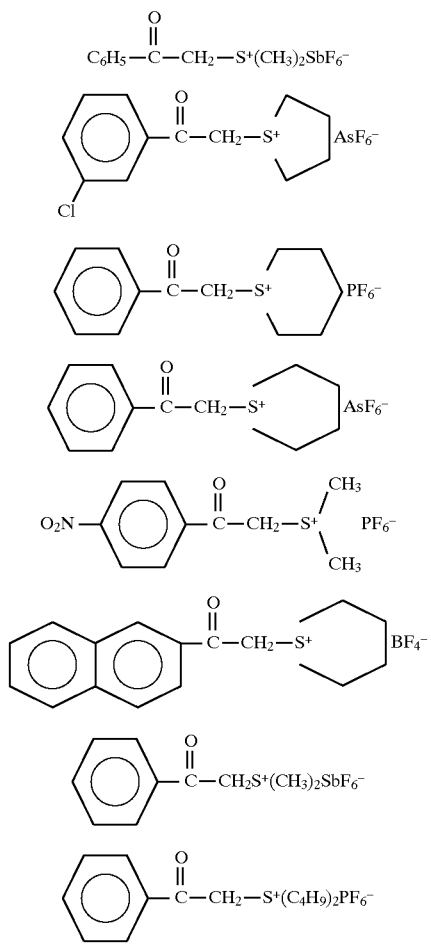

Examples of some hydroxyaryl dialkyl sulfonium salts are:

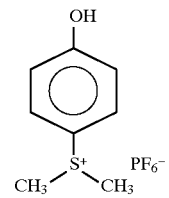

-continued

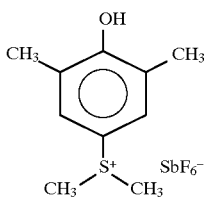

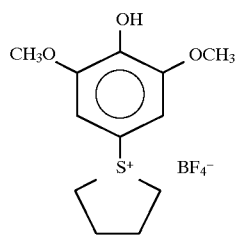

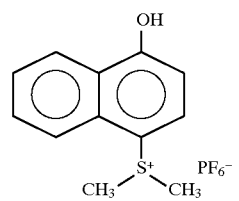

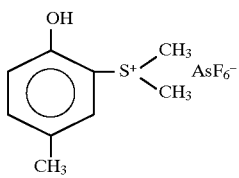

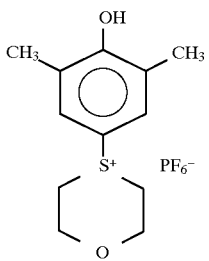

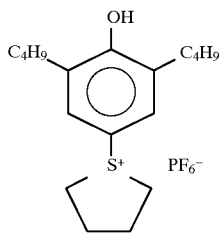

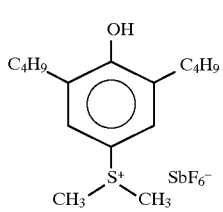

-continued

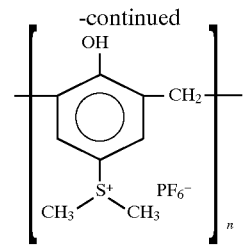

Other suitable photoinitiators are:

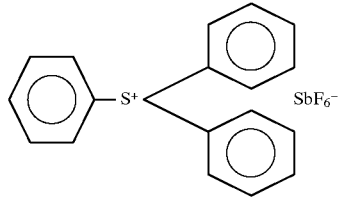

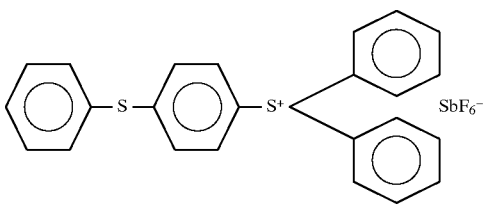

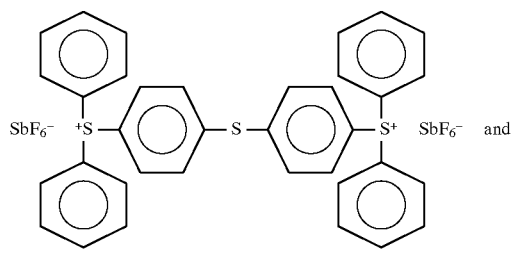

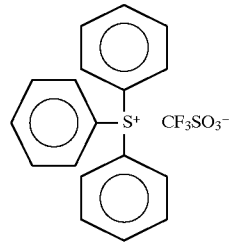

The preferred photoacid is triaryl-sulfonium hexafluoro-antimonate.

When a positive acting photoimageable composition is desired the composition also contains a Lewis acid catalyst such as dibutyl tin oxide, tetraalkyl titanate, or stannous octoate, with stannous octoate being preferred, and a cyclic anhydride. Other Lewis acids include aluminum chloride, boron trifluoride, ferric chloride, titanium chloride, and zinc chloride; salts of weak acids, such as sodium acetate, sodium cyanide, sodium cyanate, potassium thiocyanate, sodium bicarbonate, and sodium boronate, metal carboxylates and metal chelates, such as cobalt, iron, zinc, and copper acetylacetonate or octoates or naphthenates.

The cyclic anhydride can be any of the well known anhydride curing agents (see, for example, Lee and Neville, *Handbook of Epoxy Resins*, McGraw-Hill, 1967, Chapter 12) including hexahydrophthalic anhydride, methylhexahydrophthalic anhydride, nadic methyl anhydride, maleic anhydride, and the like.

The photoinitiator employed is present in an amount sufficient to either retard or initiate the polymerization of the diepoxide, depending upon the type of photoinitiator employed. Usually the amount of photoinitiator is about 0.5% to about 10% by weight and preferably about 3% to about 5% by weight based upon the solid resin weight.

In addition, when desired the compositions can include other ingredients such as a thickener or flexibilizer to improve film-forming properties and a solvent to modify the viscosity for spinning films. The thickener or flexibilizer can be any number of oligomeric or polymeric materials that are compatible with the epoxy material. Examples include phenoxy resins and polyether and polyester dials such as poly(propylene glycol), poly(ethylene glycol), poly(caprolactane) dial and poly(oxylutylene) dial. Also butadiene-acrylontule copolymers such as HYCAR® from B. F. Goodrich and maleic anhydride adducts of polybutadiene resins, e.g. —R— 130 from Ricon Resins can be used as the flexibilizer.

The phenoxy resins, also referred to as thermoplastic polyhydroxy ethers, are generally reaction products of substantially equal molar quantities of a dihydric phenol and epichlorohydrin having a degree of polymerization such that the molecular weight is about 20,000 to about 50,000, and preferably at least about 22,000. Generally to obtain such molecular weights, the degree of polymerization is at least about 30 and preferably at least about 70. Excellent results have been obtained when employing phenoxy polymers having molecular weights from about 25,000 to about 38,000. The polyhydroxy ethers or phenoxy polymers are substantially free from 1,2-epoxy groups.

The phenoxy polymers can be represented by the repeating unit:

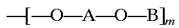

wherein A is the radical residuum of a polynuclear dihydric phenol and B is an hydroxyl-containing radical residuum of epichlorohydrin. m is the degree of polymerization and generally is at least about 30. The preferred phenoxy polymers are those wherein the dihydric phenol is bisphenol A (i.e. 2,2-bis(p-hydroxy phenyl)propane and can be represented by having the repeating unit:

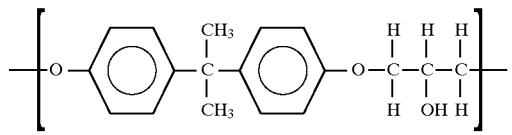

By representation of the above repeating units, it is not intended to be an assertion that the phenoxy polymers have only the configuration of pure linear polymers. For instance, some branching can occur by reaction of epichlorohydrin or dihydric phenol or both, with pendant hydroxyl groups of the growing polyhydroxy ether chain. Accordingly, the representation of the thermoplastic phenoxy polymers in the terms of the repeating unit:

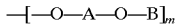

is a useful means for determining stoichiometry and the like but is not an accurate depiction of structure such as one may obtain from a monomer or a low molecular weight compound.

The phenoxy polymers employed according to the present invention are substantially free from 1,2-epoxy groups as evidenced by the application of the two "epoxide equivalent" analytical tests described in "*Epoxy Resins*" by A. Lee and K. Neville, pages 21–25, McGraw-Hill, Inc., New York (1957). Examples of some suitable dihydric phenols can be found in U.S. Pat. No. 3,424,707 to Schaufelberger, disclosure of which dihydric phenols is incorporated herein by reference. Mixtures of the phenoxy polymers can be employed if desired.

Some commercially available phenoxy polymers include Eponol 53, Eponol 55, Epon 1009, Phenoxy PAHJ, Phenoxy PKHC, Phenoxy PKHA, and Phenoxy PKHH.

In addition, the compositions, when desired, can include an organic non-reactive diluent to facilitate the coating operation. Examples of suitable solvents include ketones such as acetane, methyl ethyl ketone, methyl isobutyl ketone and methyl amyl ketone, and methylene chloride. When employed, the diluent is present in an amount sufficient to provide compositions for coating application.

The compositions can be coated onto substrates such as metal, composites such as epoxy, cyanate ester, and polyimide based laminates, ceramics, and glass or other materials onto which photoprocessable coatings are normally employed. The compositions can be applied by various known coating techniques such as spinning, spraying, dipping, film laminating or passing the substrate through a bath of the composition.

The best solvents for dissolving the cleavable epoxide networks are those containing an alcohol and an acid such as methanesulfonic acid or p-toluenesulfonic acid.

However, suitable acids include organic acids such as acetic acid, propionic acid, chloroacetic acid, benzoic acid and the like; sulfonic acids such as benzenesulfonic acid, p-toluenesulfonic acid, methanesulfonic acid and the like; inorganic acids such as sulfuric acid, phosphoric acid, hydrochloric acids and the like; and Lewis acids such as boron trifluoride etherate, aluminum chloride, stannic chloride and the like. The solvent mixtures are given only as examples to illustrate the type of solvents and acids to be used. The preferred acids are methanesulfonic acid and p-toluenesulfonic acid.

The process for using the photoresist compositions of this invention depends on whether the composition is positive-acting or negative-acting. For a positive-acting composition, the substrate is coated with the composition by spinning, spraying or the like. If solvent is used, the substrate is heated on a hot plate briefly to dry off the solvent and form a film. The film is then cured in an oven at about 100°–165° C. for about 15–90 min., exposed to electromagnetic radiation through a mask, followed by an optional post-exposure bake at about 50°–150° C. for about 1–15 min. The positive image of the mask is developed by dissolving the exposed regions in an alcohol solvent, such as ethanol, n-butanol or preferably 2,2,2-trifluoroethanol, optionally containing another organic solvent such as xylene or propylene glycol monomethyl ether acetate and optionally heated at temperatures from about 30° C. up to the boiling point of the solvent or solvent mixture.

The remaining photoresist can then be used as, for example, a mask for vacuum etching an underlying layer of metal. As a crosslinked epoxy network, it serves as a robust, etch-resistant barrier to the etchant gases. Following the completion of patterning of the underlying layer, the photoresist is easily stripped off by exposure to a mixture of alcohol containing a small amount of acid, such as about 0.3M p-toluenesulfonic acid in ethanol, or about 0.3M methanesulfonic acid in 2,2,2-trifluoroethanol, optionally heated at 50°–80° C.

For a negative-acting composition, the substrate is coated by spinning, spraying and the like. If a solvent is used, the substrate is heated on a hot plate briefly to dry off solvent. The photoresist is then exposed to electromagnetic radiation through a mask, followed by an optional post-exposure bake at about 50°–150° C. for about 1–15 min. The negative image is developed by dissolving the unexposed regions in a solvent such as isopropyl alcohol, acetone or propylene glycol monomethyl ether acetate. The substrate is patterned by etching or plating; and the negative photoresist image is stripped off by exposure to a solvent such as about 0.3M methanesulfonic acid in ethanol at about 50°–80° C. for about 1–15 min.

A process for using positive-acting lift-off compositions of the invention includes coating a substrate with the photoimageable lift-off composition such as by spinning, spraying, and the like. If a solvent is used, the coating is heated briefly to dry off solvent. The lift-off layer is thermally cured to a crosslinked film by heating in an oven at about 100°–165° C. for about 15–90 min. The lift-off layer is then exposed to electromagnetic radiation through a mask followed by an optional post-exposure bake at about 50°–150° C. for about 1–15 min; and the positive image of the mask is developed by removal of the exposed regions with an alcohol solvent, such as ethanol, n-butanol or preferably 2,2,2-trifluoroethanol, optionally containing another organic solvent such as xylene or propylene glycol monomethyl ether acetate and optionally heated at temperatures from about 30° C. up to the boiling point of the solvent or solvent mixture. Blanket deposition is used to apply the next layer of material on the substrate by evaporation, sputtering or electrolytic plating; and the undesired material is lifted off with the composition of this invention by exposure to a mixture of alcohol containing a small amount of acid, such as about 0.3M p-toluenesulfonic acid in ethanol, or about 0.3M methanesulfonic acid in 2,2,2-trifluoroethanol, optionally heated at about 50°–80° C.

For a negative-acting lift-off composition, the substrate is coated by spinning, spraying, or the like. If a solvent is used, the substrate is heated on a hot plate briefly to dry off solvent. The lift-off layer is then exposed to electromagnetic radiation through a mask, followed by an optional post-exposure bake at about 50°–150° C. for about 1–15 min. The negative image is developed by dissolving the unexposed regions in a solvent such as isopropyl alcohol, acetone or propylene glycol monomethyl ether acetate. Blanket deposition is used to apply the next layer of material on the substrate by evaporation, sputtering or electrolytic plating; and the undesired material is lifted off with the composition of this invention by exposure to a mixture of alcohol containing a small amount of acid, such as about 0.3M p-toluenesulfonic acid in ethanol, or about 0.3M methanesulfonic acid in 2,2,2-trifluoroethanol, optionally heated at about 50°–80° C.

The following non-limiting examples are presented to further illustrate the present invention.

EXAMPLE 1

Acetal diepoxide (about 1.8 parts by weight), hexahydrophthalic anhydride (about 0.91 parts by weight), Union Carbide UVI-6974 photoinitiator (about 0.54 parts by weight), stannous octoate (about 0.03 parts by weight), and ethylene glycol (about 0.02 parts by weight) were blended together in dim light. The solution was filtered through a 0.2 micron filter and spun on silicon wafers at 3000 rpm for about 30 sec. and cured at about 130° C. for about 30 min. to form clear, 4 μm thick films. The films were exposed for about 5 min. with a Hg lamp through a test mask and heated on a 90° C. hotplate for about 1 min. A positive image of the mask was developed by dipping the film in a beaker of 2,2,2-trifluoroethanol for about 5 min. The image was stripped in about 3 minutes in 0.3M methanesulfonic acid in 2,2,2-trifluoroethanol at about 70° C.

EXAMPLE 2

Acetal diepoxide was blended with triarylsulfonium hexafluoroantimonate at a level of 5% by weight. The photoacid dissolved easily and the resulting solution was coated on a test wafer by spinning. The film was exposed to broad band (G-, H- and I-line) UV radiation at 300 mJ/cm$^2$ for about 2 min. through a simple test mask, post-based at about 85° C. for about 2 min., then developed in isopropyl alcohol or propylene glycol monomethyl ether acetate for about 1–2 min. A clearly discernible negative image of the mask was obtained. This image was stripped in less than 1 min. at about 70° C. in 2,2,2-trifluoroethanol containing 0.3M methanesulfonic acid.

What is claimed is:

1. A strippable photoimageable composition comprising:

a cycloaliphatic diepoxide wherein the epoxy groups are connected through an acyclic acetal moiety; and a photoactive compound that releases acid upon being exposed to electromagnetic radiation.

2. The composition of claim 1 wherein said diepoxide is selected from the group consisting of acetaldehyde bis-(3,4-epoxycyclohexyl methyl) acetal, acetone bis-(3,4-epoxycyclohexylmethyl) ketal, and formaldehyde bis-(3,4-epoxycyclohexylmethyl) acetal.

3. The composition of claim 1 wherein said diepoxide is acetaldehyde bis-(3,4-epoxycyclohexylmethyl) acetal.

4. The composition of claim 1 wherein said photoactive compound is an onium salt of a Group VIA or a Group VIIA element.

5. The composition of claim 1 in which the compound is a triarylsulfonium salt.

6. The composition of claim 1 which is a negative photoresist.

7. The composition of claim 1 which also contains a Lewis acid and a dicarboxylic anhydride and is a positive phoresist.

8. The composition of claim 1 in which the radiation is ultraviolet, electron-beam or x-ray.

9. A process for patterning a substrate which comprises applying the composition of claim 1 to said substrate, exposing said composition to electromagnetic radiation, and developing the pattern in said composition.

10. The process of claim 9 wherein said composition is used as a photoimageable lift-off layer.

11. The process of claim 9 wherein said composition is used as a photoresist.

12. The process of claim 9 wherein the diepoxide in said composition is selected from the group consisting of acetaldehyde bis-(3,4-epoxycyclohexylmethyl) acetal, acetone bis-(3,4-epoxycyclohexylmethyl) ketal, and formaldehyde bis-(3,4-epoxycyclohexylmethyl) acetal.

13. The process of claim 12 wherein said diepoxide is acetaldehyde bis-(3,4-epoxycyclohexylmethyl) acetal.

14. The process of claim 9 wherein the photoactive compound in said composition is an onium salt of a Group VIA or a Group VIIA element.

15. The process of claim 14 wherein the photoactive compound is a triarylsulfonium salt.

16. The process of claim 9 wherein said composition is a negative photoresist.

17. The process of claim 16 wherein the developing comprises dissolving unexposed regions of the composition in isopropyl alcohol, acetene or propylene glycol monomethyl ether acetate.

18. The process of claim 9 wherein said composition also contains a Lewis acid and a dicarboxylic anhydride and is a positive photoresist.

19. The process of claim 18 wherein the developing comprises dissolving exposed regions of the composition in an alcohol solvent.

20. The process of claim 19 wherein said alcohol solvent includes ethanol, n-butanol or 2,2,2-trifluoroethanol.

21. The process of claim 20 wherein further includes xylene or propylene glycol monomethyl ether acetate along with the alcohol.

22. The process of claim 9 in which the radiation is ultraviolet, electron-beam or x-ray.

23. The process of claim 9 wherein further comprises removing the composition remaining often the developing by dissolving in a mixture of alcohol and a small amount of an acid.

24. The process of claim 23 wherein said alcohol involves ethanol, n-butanol or 2,2,2 trifluoroethanol and said acid is selected from the group consisting of acetic acid, propionic acid, chloroacetic acid, benzoic acid, sulfonic acids, sulfuric acid, phosphoric acid, hydrochloric acids, and Lewis acids.

25. The process of claim 23 wherein said mixture is 0.3M p-toluenesulfonic acid in ethanol, or about 0.3M methanesulfonic acid in 2,2,2-trifluoroethanol.

26. The process of claim 25 wherein the dissolving is carried out at 50–80° C.

* * * * *